(12) United States Patent
Buettgen et al.

(10) Patent No.: US 9,698,196 B2
(45) Date of Patent: Jul. 4, 2017

(54) DEMODULATION PIXEL INCORPORATING MAJORITY CARRIER CURRENT, BURIED CHANNEL AND HIGH-LOW JUNCTION

(75) Inventors: Bernhard Buettgen, Adliswill (CH);
Jonas Felber, Niederbipp (CH);
Michael Lehmann, Winterthur (CH);
Thierry Oggier, Zurich (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 1325 days.

(21) Appl. No.: 12/856,701

(22) Filed: Aug. 16, 2010

(65) Prior Publication Data

US 2011/0089471 A1    Apr. 21, 2011

Related U.S. Application Data

(60) Provisional application No. 61/233,961, filed on Aug. 14, 2009.

(51) Int. Cl.
*H01L 31/08* (2006.01)
*H01L 27/144* (2006.01)
*H01L 27/148* (2006.01)

(52) U.S. Cl.
CPC .............................. *H01L 27/14812* (2013.01)

(58) Field of Classification Search
CPC ................................................ H01L 27/14812
USPC ........................................ 257/222, E31.052
See application file for complete search history.

(56) References Cited

U.S. PATENT DOCUMENTS

| 5,856,667 A | 1/1999 | Spirig et al. |
| 6,184,055 B1 * | 2/2001 | Yang et al. ................... 438/57 |
| 7,498,621 B2 | 3/2009 | Seitz |
| 2006/0108611 A1 | 5/2006 | Seitz |

(Continued)

FOREIGN PATENT DOCUMENTS

| DE | 197 04 496 A1 | 3/1998 |
| EP | 1 624 490 A1 | 2/2006 |

(Continued)

OTHER PUBLICATIONS

Schwarte, R., et al.; "A New Electro-optical Mixing and Correlating Sensor: Facilities and Applications of the Photonic Mixer Device (PMD)", 1997, SPIE—Int. Opt. Eng, p. 245-53.*

(Continued)

*Primary Examiner* — Marcos D Pizarro
(74) *Attorney, Agent, or Firm* — Fish & Richardson P.C.

(57) ABSTRACT

A demodulation pixel improves the charge transport speed and sensitivity by exploiting two effects of charge transport in silicon in order to achieve the before-mentioned optimization. The first one is a transport method based on the CCD gate principle. However, this is not limited to CCD technology, but can be realized also in CMOS technology. The charge transport in a surface or even a buried channel close to the surface is highly efficient in terms of speed, sensitivity and low trapping noise. In addition, by activating a majority carrier current flowing through the substrate, another drift field is generated below the depleted CCD channel. This drift field is located deeply in the substrate, acting as an efficient separator for deeply photo-generated electron-hole pairs. Thus, another large amount of minority carriers is transported to the diffusion nodes at high speed and detected.

12 Claims, 6 Drawing Sheets

(56) References Cited

U.S. PATENT DOCUMENTS

| | | |
|---|---|---|
| 2008/0048212 A1* | 2/2008 | Nakashima et al. .......... 257/222 |
| 2008/0239466 A1 | 10/2008 | Buettgen |
| 2009/0278174 A1* | 11/2009 | Ichikawa et al. ............. 257/222 |

FOREIGN PATENT DOCUMENTS

| | | |
|---|---|---|
| GB | 2 389 960 A | 12/2003 |
| WO | 2006/012761 A1 | 2/2006 |

OTHER PUBLICATIONS

Buettgen, B., et al., "Dennodultion Pixel Based on Static Drift Fields", IEEE Transactions on Electron Devices, Nov. 2006, pp. 2741-2747, vol. 53, No. 11.

Buettgen, B., "Extending Time-of-Flight Optical 3D-Imaging to Extreme Operating Conditions", Ph.D. Thesis, University of Neuchatel, 2006.

Durini, D., et al., "Lateral drift-field photodiode for low noise, high-speed, large photoactive-area CMOS imaging applications", Nuclear Instruments and Methods in Physics Research Section A: Accelerators, Spectrometers, Detectors and Associated Equipment, Dec. 2010, pp. 470-475, vol. 624, No. 2, Elsevier B.V.

Henke, W., et al., "Simulation and experimental study of gray-tone lithography for the frabrication of arbitrarily shaped surfaces", IEEE Workshop on Micro Electro Mechanical Systems, 1994, pp. 205-210.

Sinha, A., et al., "Effect of back surface field on photocurrent in a semiconductor junction", Solid-State Electronics, 1977, pp. 943-951, vol. 21, Pergamon Press Ltd., Great Britain.

Sinha, A., et al., "Effect of Heavy Doping on the Properties of High-Low Junction", IEEE Transactions on Electron Devices, Dec. 1978, vol. Ed-25, No. 12.

Tubert, C., et al., "High Speed Dual Port Pinned-photodiode for Time-of-Flight Imaging", International Image Sensor Workshop, 2009, 3 pages, Bergen, Norway.

Ushinaga, T., et al., "A QVGA-size CMOS Time-of-Flight Range Image Sensor With Background Light Charge Draining Structure", Three-Dimensional Image Capture and Applications VII, Proceedings of SPIE, Jan. 2006, pp. 34-41, vol. 6056.

Van Nieuwenhove, D., et al., "Novel Standard CMOS Detector using Majority Current for guiding Photo-Generated Electrons towards Detecting Junctions", Proceedings Symposium IEEE/LEOS Benelux Chapter, 2005.

* cited by examiner

DEMODULATION PIXEL INCORPORATING MAJORITY CARRIER CURRENT, BURIED CHANNEL AND HIGH-LOW JUNCTION

RELATED APPLICATIONS

This application claims the benefit under 35 USC 119(e) of U.S. Provisional Application No. 61/233,961, filed on Aug. 14, 2009, which is incorporated herein by reference in its entirety.

BACKGROUND OF THE INVENTION

Time resolving or demodulating pixels have different fields of applications. Two typical examples are three dimensional (3D) range imaging and fluorescence lifetime imaging. Basically, in both applications higher in-pixel charge transport speed and higher optical sensitivity lead to more accurate per-pixel measurements.

The time-domain demodulation of modulated light signals at the pixel level requires in all approaches the switching of a photo-generated charge current. It is possible to handle electron as well as hole currents. The common methods, however, use the photo-generated electron currents due to the higher mobility of electrons in the semiconductor material.

Some pixel architectures do the necessary signal processing based on the photo-current whereas other architectures work in the charge domain directly.

Common to all pixels is the necessary transfer of charges through the photo-sensitive detection region to a subsequent storage area or to a subsequent processing unit. In the case of charge-domain based pixel architectures, the photo-charge is generally transferred to a storage node. In order to demodulate an optical signal, the pixel has to have implemented at least two integration nodes that are accumulating the photo-generated charges during certain time intervals. Another minimum requirement would be the implementation of at least one integration node and having typically at least one other node for dumping charge carriers as well.

Different pixel concepts have been realized in the last few decades. Schwarte, in "Verfahren und Vorrichtung zur Bestimmung der Phasen-und/oder Amplitudeninformation einer elektromagnetischen Welle", published Mar. 12, 1998, as DE 197 04 496 A1; introduced a demodulation pixel, which transfers the photo-generated charge below a certain number of adjacent poly-silicon gates to discrete accumulation capacitances. Spirig, in U.S. Pat. No. 5,856,667 [SPI99], titled "Apparatus and method for detection of an intensity-modulated radiation field", disclosed a charge coupled device (CCD) lock-in concept that allows the in-pixel sampling of the impinging light signal with theoretically an arbitrary number of samples. Another very similar pixel concept has been demonstrated by T. Ushinaga et al. in "A QVGA-size CMOS time-of-flight range image sensor with background light charge draining structure", published in Three-dimensional image capture and applications VII, Proceedings of SPIE, Vol. 6056, pp. 34-41, 2006; where a thick field-oxide layer is used to smear the potential distribution below the demodulation gates.

A common problem of the afore-mentioned pixel approaches is the slowness of the charge transport through the semiconductor material, which decreases significantly the accuracy or quality of the in-pixel demodulation process. In all pixel structures, the limiting factor for the transport speed is the non-perfect linear potential distribution in the semiconductor substrate that is used to transport the charges through the semiconductor in lateral direction.

The first 3-D cameras that are based on highly-integrated demodulation pixels used the CCD lock-in pixels [SPI99]. However, their limitations in speed and in achievable distance measurement accuracy led to a change of the pixel concepts used. Today's most advanced 3-D cameras implement drift field pixels in order to be able to operate at high frequencies so that 3-D imaging with sub-millimeter resolution becomes possible, as described in [BUE06A] B. Büttgen, "Extending Time-of-Flight Optical 3D-Imaging to Extreme Operating Conditions", Ph.D. thesis, University of Neuchatel, 2006; and [BUE06B] B. Büttgen, F. Lustenberger and P. Seitz, "Demodulation Pixel Based on Static Drift Fields", IEEE Transactions on Electron Devices, 53(11):2741- 2747, Nov. 2006. Measurements with such cameras have proven the pixel concept and have shown that gigaHertz demodulation becomes possible with comparable pixel pitches and fill factors as achieved with the standard CCD lock-in pixels [BUE06B].

New concepts of pixels have been explored in the last years accelerating the in-pixel transport of the charges by improving the characteristics of the lateral electric drift fields. Seitz, [SEI02] in U.S. Pat. Appl. Publ. No. US 2006/0108611 A1, invented the first drift field demodulation device that is based on a very high-resistive poly-silicon gate electrode. It even allows very easily the design of pixels that can generate an arbitrary number of samples. The concept was proven by Buettgen [BUE05A] in U.S. Pat. Appl. Publ. No. US 2008/0239466 A1, who disclosed later another concept of demodulation pixels: the static drift field pixel [BUE06B]. In contrast to the architectures mentioned before, the static drift field pixel clearly separates the detection from the demodulation regions within the pixel. It further shows lower power consumption compared to the drift field demodulation approach of Seitz and, at the same time, it supports fast in-pixel lateral charge transport.

Another pixel concept was presented by Nieuwenhoven [NIE05] in "Novel Standard CMOS Detector using Majority Current for guiding Photo-Generated Electrons towards Detecting Junctions", Proceedings Symposium IEEE/LEOS Benelux Chapter, 2005. In this pixel architecture a modulated lateral electric drift field is generated by the current of majority carriers within the semiconductor substrate. Minority carriers are generated by the photons and transported to the particular side of the pixel depending on the induced current, or applied drift field consequently.

One major application of demodulation pixels is found in real-time 3-D imaging. By demodulating the optical signal and applying the discrete Fourier analysis on the samples acquired, parameters such as amplitude and phase can be extracted for the frequencies of interest. If the optical signal is sinusoidally modulated, the extraction based on at least three discrete samples will lead to the offset, amplitude and phase information. The phase value corresponds proportionally to the sought distance value. Such a harmonic modulation scheme is often used in real-time 3-D imaging systems having incorporated the demodulation pixels [BUE06A].

The precision of the pixel-wise distance measurement is determined by the speed of the in-pixel transfer of the electrons from the area, where they are generated, to the area, where they are accumulated or post-processed. Thus, the ability of the pixel to sample high modulation frequencies is of high importance to perform distance measurements with high accuracy.

SUMMARY OF THE INVENTION

Each of the three major concepts of drift field pixels has its particular drawbacks restricting the 3-D imaging applications.

The drift field demodulation pixel of Seitz [SEI02] generates the lateral drift field by a constant electronic current through the poly-silicon gate. In order to reduce the power consumption, the gate should be as resistive as possible. However, the creation of sensors with large pixel counts is not possible without increasing the sensor's power consumption. The high in-pixel power consumption has also a negative impact on the thermal heating of the sensor and hence, on its dark current noise. Enhanced drift field demodulation pixel concepts disclosed by Buettgen in WO 2006/012761 A1, titled "Large-area pixel for use in an image sensor", make use of dendritic gate structures. However, these structures just moderate the problem of in-pixel power consumption, but they do not solve it completely.

The drift field pixel of Nieuwenhoven [NIE05] generates the drift field in the substrate by the current flow of majority carriers. One major problem of this pixel concept is the self-heating of the pixel and the associated dark current noise. Furthermore, the quantum efficiency suffers from the fact that the same semiconductor region is used to create the drift field by a current of majority carriers and to separate the minority carriers. High recombination rates are the result— reducing the optical sensitivity. Another drawback is that the induced current needs to be modulated at high-speed throughout all the pixels on the imager and, therefore, the resistive and capacitive optimized routing becomes difficult.

The demodulation pixel based on static drift fields [BUE05a] requires the creation of a large region having a lateral electric drift field that guides electrons in the direction of the demodulation region. The drift region is currently implemented as non-uniform doping profiles, so-called built-in drift fields, as shown by Cédric Tubert et al. in "High Speed Dual Port Pinned-photodiode for Time-Of-Flight Imaging", International Image Sensor Workshop Bergen 2009; D. Durini et al. in "Lateral drift-field photodiode for low noise, high-speed, large photoactive-area CMOS imaging applications", Nuclear Instruments and Methods in Physics Research A, 2010; or a successive CCD gate structure [BUE06B]. In the case of the gate structure, each gate has a minimum width and the gate voltages linearly increase in the direction of the demodulation region. Those voltages are all constant, meaning that the lateral electric drift field is constant, also. A major drawback is the complex layout; in particular the connection of the gates to the constant voltages is difficult to realize. Even more dramatically, if a pure CCD process is used, the routing rules are more restricting than in a complementary metal-oxide-semiconductor (CMOS) process with CCD option generally making such a design more impractical.

Another drawback of the afore mentioned static drift field pixel structures is the fact that charge carriers generated deep in the semiconductor substrate cannot be demodulated or even detected. The collection depth inside the semiconductor is mainly determined by the depth of the shallow space charge region created by the implemented drift field structure.

In general, the invention features the combination of the following three pixel enhancement mechanisms: a) the enhanced charge transport and photo-sensitivity through a buried channel, b) the enhanced charge transport and photo-sensitivity enforced deeply in the semiconductor by majority carrier current, and/or c) the enhanced charge transport and photo-sensitivity achieved by the exploitation of high-low junctions or graded/gradually doped wafer structures. This results in a new pixel structure that outperforms prior-art demodulation pixels in terms of charge transport speed and photo-sensitivity.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The following description is based on the semiconductor materials with a p-type silicon substrate such that the electrons rather than holes are collected for processing. It is also possible to use n-doped silicon so that all doping and voltage relationships are swapped accordingly. Thus, the description herein is not to be understood as a limitation for using just p-doped semiconductor substrates. The same is meant for the photo-currents, which can either be electron or hole current depending on the type of doping of the semiconductor material.

Figure 1:
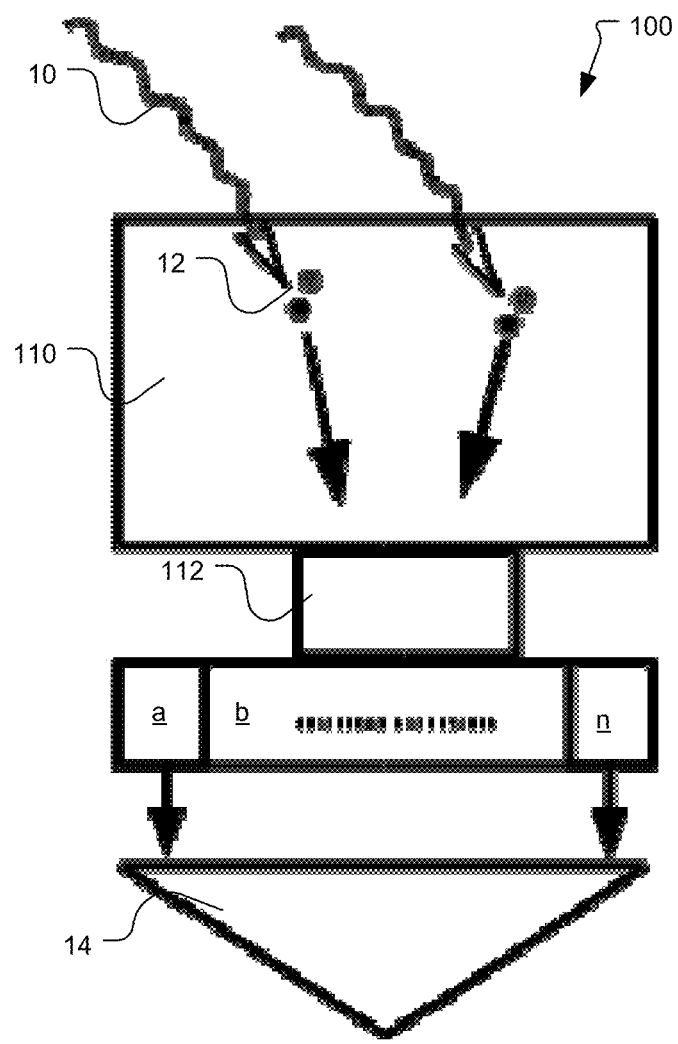
FIG. 1 is a schematic diagram of a demodulation pixel to which the present invention is applied in embodiments.

FIG. 1 is a schematic diagram of a demodulation pixel 100. Photons 10 impinge onto the sensitive area 110 and create electron-hole pairs 12. In general the holes are drained by the substrate and the electrons are used as the charge carriers for the signal processing and extraction of the information. The sensitive region 110 transports the electrons as fast as possible to the demodulation region 112 in order to support high (de)modulation frequencies. The output of the demodulation region is a number of charge packets into storage nodes a, b, . . . n, which correspond to the samples of the optical signal. In general, the samples are amplified and readout in circuitry 14.

According to a preferred embodiment of the present invention, the photo-sensitive region is optimized in terms of sensitivity and charge transport speed. To achieve maximum photo-sensitivity and fast in-pixel charge transport at the same time, one or more of three aforementioned pixel enhancement mechanisms are exploited, which can arbitrarily be combined together.

Figure 2:
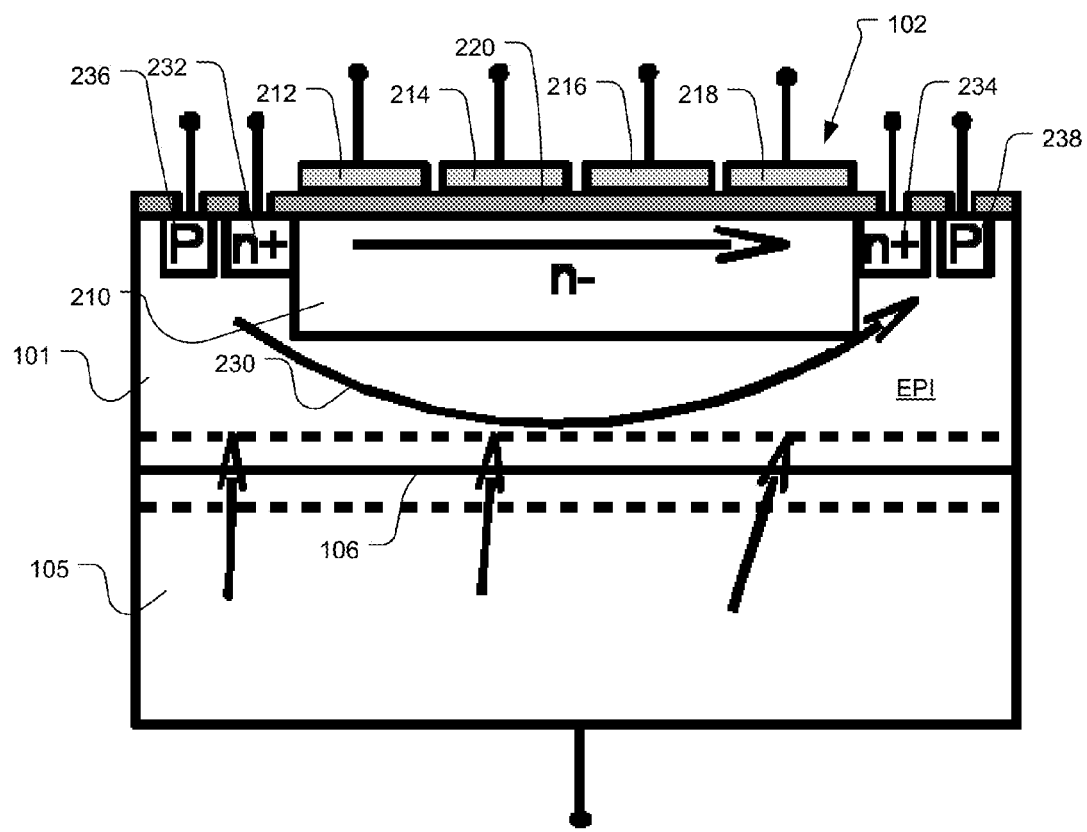
FIG. 2 is a schematic diagram showing photo-sensitivity enhancement and fast in-pixel charge transport mechanisms.

FIG. 2 is a schematic diagram showing photo-sensitivity and fast in-pixel charge transport mechanism for the sensitive region 110 of a demodulation pixel.

A first mechanism incorporates a shallow doping implantation layer 210 in the substrate 101 that creates a depleted region that separates and collects photo-generated charges. Since the layer 210 is close to the semiconductor surface, it is particularly highly sensitive to optical wavelengths in the visible part of the electromagnetic spectrum but also certain fractions of charge carriers generated by long wavelength radiation, e.g. near infrared light, are collected by this layer. The lateral charge transport through this doping layer can efficiently be realized for example by photo-transparent gates 212, 214, 216, 218 on top of a silicon oxide insulating layer 220, so that the potential distribution applied to the gates 212, 214, 216, 218 is mirrored into the doping layer 210. This technique is well-known from CCD devices. Depending on the particular gate arrangement, the speed of the lateral charge transport can be optimized. Embodiments for highest transport speeds are disclosed in patent [BUE05A]. A successive gate arrangement is shown. The idea of this embodiment is that the gate widths are small and increasing voltages are applied to the gates from left to right. Due to the small gate sizes and the buried channel implantation, the voltage distribution mirrored to the channel is smeared. Finally, an almost linearly increasing potential distribution in the channel is obtained, which is essential for a fast lateral charge transport. The implementation of the buried channels in general renders the electrical field deeper in the silicon, but for sensing and demodulating light in the near-infrared wavelength, the penetration depth of the depletion region in the substrate is still shorter than desired generally.

A second mechanism relies on a current 230 of majority carriers that is generated through the semiconductor substrate 101 by applying a voltage difference between nodes or p implantations 236 and 238 and thus across the pixel sensitive area 102. The current 230 flowing from p implantation 236 to p implantation 238 generates an electric field, which forces photo-generated minority charge carriers to drift into lateral direction. Here, photo-generated charge carriers are affected that are generated deeper in the substrate than the depth of the depletion region 210 of the shallow doping layer. Thus, this additional lateral force becomes more effective for electromagnetic radiation of longer wavelengths.

If the substrate 101 is p-doped as shown, the minority carriers are electrons. Since the n+ diffusion areas are set to even higher potential than the p+ regions, the electrons will be collected in the n+ diffusion nodes 232, 234. The diffusion nodes are preferably used as a sense node for accumulation of all photo-charges. Alternatively, instead of using diffusion nodes, a gate set to high potential is used in other examples as well so that the storage of the charge or even subsequent signal processing is accomplished in gate regions.

A third mechanism provides even higher photo-sensitivity and vertical transfer speed in some instances by exploiting graded or gradually doped wafer types. In the easiest case of the EPI layer on top of the higher doped bulk wafer 105, a junction at the interface occurs. Such a junction is called high-low junction. The principle of high-low junctions is described by Amitabha Sinha and S.K. Chattopadhyaya in "Effect of back surface field on photocurrent in a semiconductor junction", Solid-State Electronics, Vol. 21, pp. 943-951, 1977; and "Effect of Heavy Doping on the Properties of High-Low Junction", IEEE Transactions on Electron Devices, Vol. Ed-25, No. 12, Dec. 1978. In this new pixel architecture, the high-low junction at the EPI-bulk interface 106 is exploited for collecting additional photo-generated charge carriers that are deeply generated in the semiconductor. Those charge carriers are directly fed toward the surface and into the region of lateral drift fields so that the photo-current signal originating from deeply inside the semiconductor contributes to the global signal detection as well.

In the following the main benefits that can be obtained by embodiments of the invention are summarized:

a) High sensitivity due to the collection of charge carriers deeply generated in the silicon substrate.

b) High optical sensitivity due to the collection of charges generated deeply in the silicon and transported to the sense node by deep lateral drift fields.

c) Fast charge transport through the whole device due to strong lateral drift fields at the Si—SiO2 interface, in the highly optically sensitive buried-channel region and deep in the semiconductor.

The combination of all these three items enables the realization of highly-sensitive and fast pixel devices that allow for resolving optical time signals with an accuracy by far less than a nanosecond and with an optical sensitivity at the same time, which is beyond those of prior-art demodulation pixels.

A few examples of the invention are discussed below. They, however, do not restrict the invention from the generality of the pixel concept, which comprises an optimized pixel architecture in terms of photo-sensitivity and charge transport speed obtained by the combination of one or all of the mechanisms: 1) the enhanced charge transport through a buried channel, 2) the lateral enhanced transport deeply through the semiconductor, and 3) the deep photo-charge collection by vertical drift fields.

Figure 3:
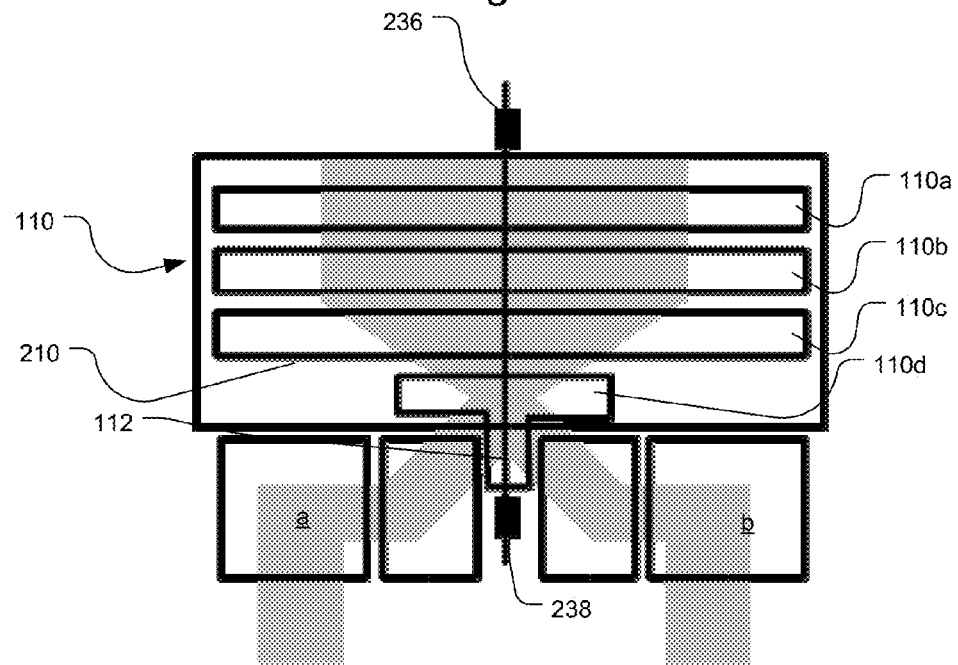
FIG. 3 shows an example for a demodulation pixel with separated detection region and demodulation region incorporating a buried channel and the n+ diffusion area.

FIG. 3 shows an example for a demodulation pixel with separated detection region 110 and demodulation region 112. A series of gates 110a, 110b, 110c, 110d are used to generate a static drift field in the detection region 110 to transport electrons to the demodulation region 112.

The funnel-shaped area 210 shows the extent of the buried channel and the n+ diffusion area. The majority current flows from p implantation 236 to p implantation 238.

Figure 4:
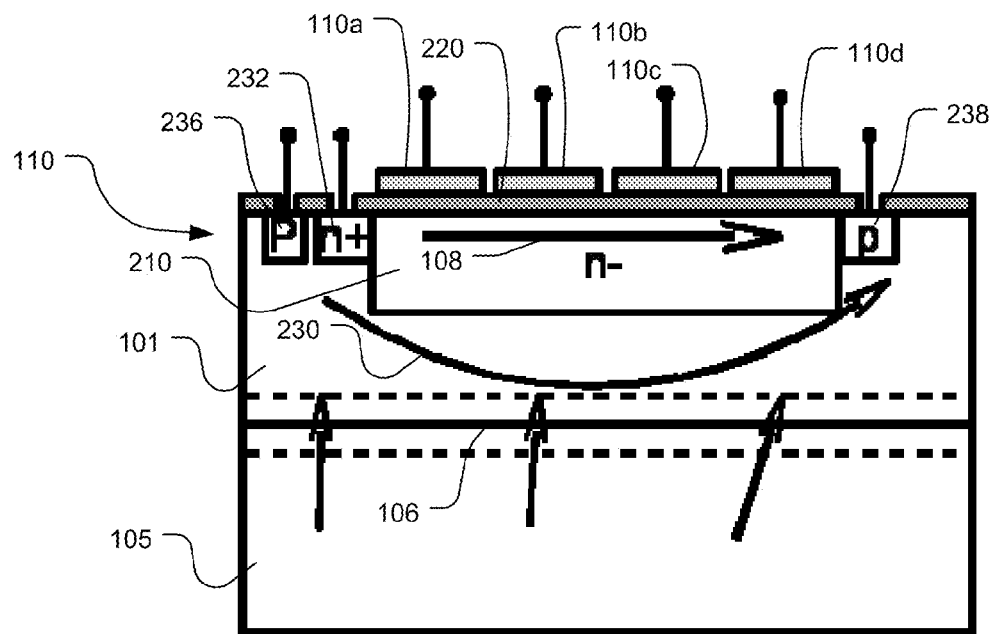
FIG. 4 shows a cross section through the detection region in which the drift field is generated by photogates.

FIG. 4 shows a cross section through the detection region 110 of FIG. 3.

The creation of the lateral drift field 108 close to the semiconductor interface is achieved by the buried channel 210 formed by the n implantation and the arrangement of a successive gate structure 110a, 110b, 110c, 110d on top of the semiconductor and the insulator layer 220, which is typically silicon dioxide. By applying increasing voltages on the gates 110a, 110b, 110c, 110d in the direction of the demodulation region 112, a monotonously increasing potential distribution inside the buried channel region 210 is obtained as well.

Figure 5:
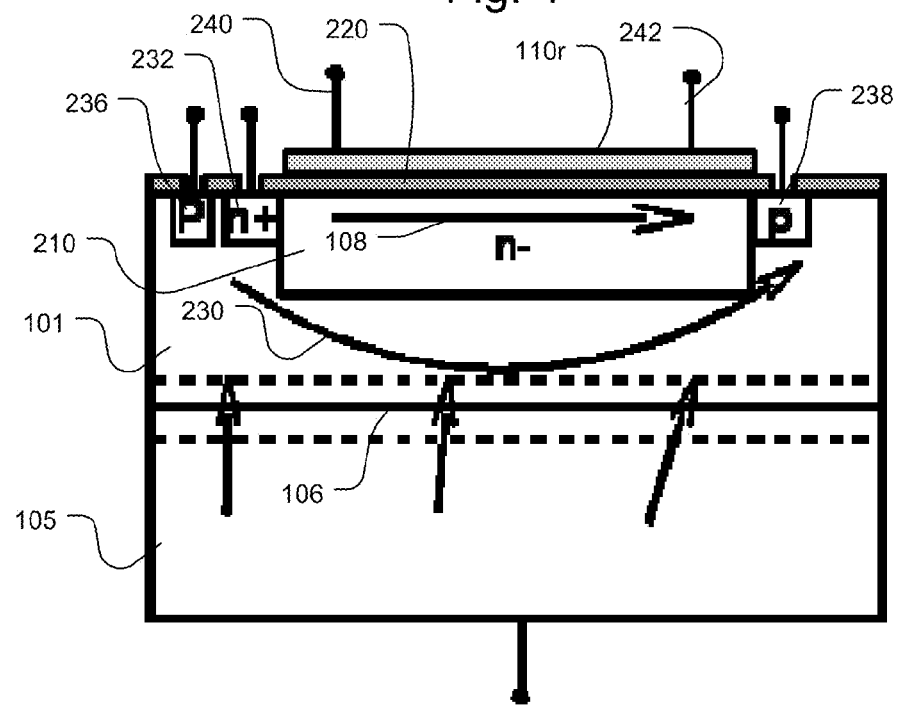
FIG. 5 shows a cross section through the detection region in which the drift field is generated by a high resistivity layer.

FIG. 5 a cross section through the detection region 110 of FIG. 3 showing another embodiment. The creation of the drift field in the n doped implantation layer of FIG. 5 is accomplished by a single high resistive gate 110r on top of the insulator layer 220. The current flowing through the gate 110r when a potential difference is applied to the two ends of it via contacts 240, 242 generates a constant drift field 108, which is seen in the buried channel 210 due to the capacitive coupling between the gate and the semiconductor substrate. This concept of drift field generation has been published in [SEI02], but here we enhance the pixel's sensitivity and speed even more by combining the prior-art drift field technique with the additional drift field concepts.

Figure 6:
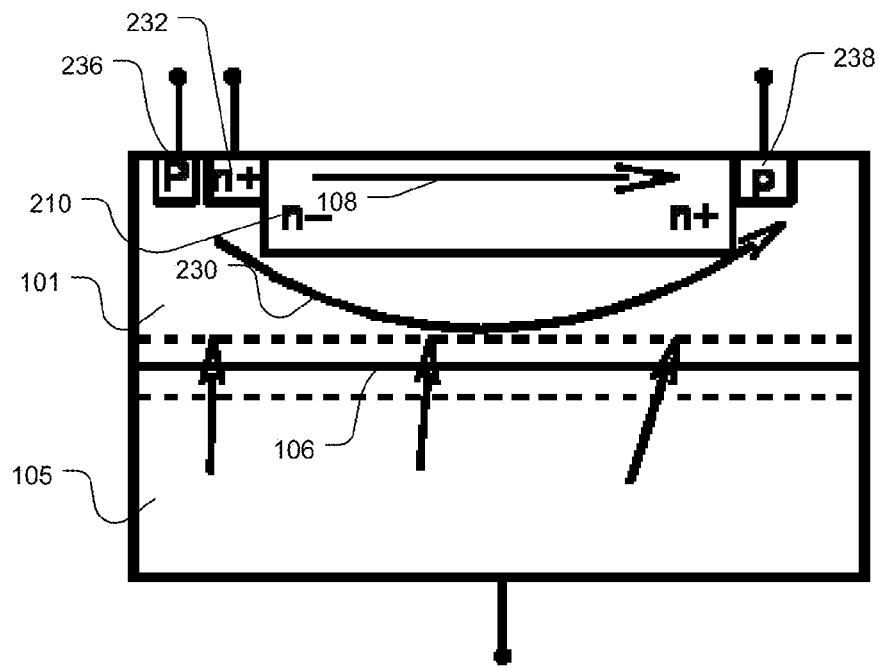
FIG. 6 shows a cross section through the detection region in which the drift field is generated by continuous change of the doping concentration of the n implantation; so-called built-in drift fields.

FIG. 6 shows another example for the creation of the drift field in a cross section through the detection region 110 of FIG. 3. It uses a continuous change of the doping concentration of the n implantation 210 in a lateral direction and in the direction of the demodulation region. This means a change of the built-in voltage, so that the lateral electric field does not necessarily require the application of external voltages. Such a variation of the doping concentration is achieved by designing for example several layers of step-wise increasing doping concentrations. The process-inherent temperature diffusion steps are exploited for smearing the rather step-wise doping profile to a profile of more constant gradient. This technique assumes a certain flexibility of the process meaning that several doping profiles are available. Another possibility for the creation of a constant doping profile's gradient is the exploitation of gray-scale mask lithography as described by W. Henke et al. in "Simulation and experimental study of gray-tone lithography for the fabrication of arbitrarily shaped surfaces", IEEE Workshop on Micro Electro Mechanical Systems, 1994, MEMS '94, pp. 205-210.

Figure 7:
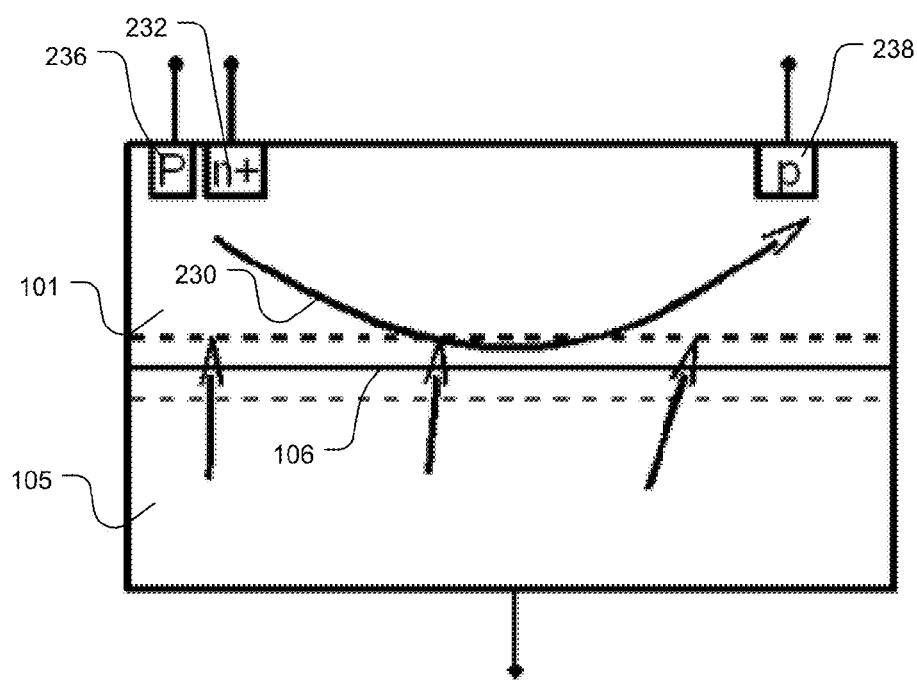
FIG. 7 shows a cross section through the detection region.

FIG. 7 shows an example where just two of the charge transport mechanisms are used within the detection region 110 of FIG. 3. There is no buried layer anymore. The charge transport is only realized by the static lateral drift field generated by the majority carrier current 230 and the deeply generated electrons are collected by the vertical drift field components around interface 106.

Figure 8:
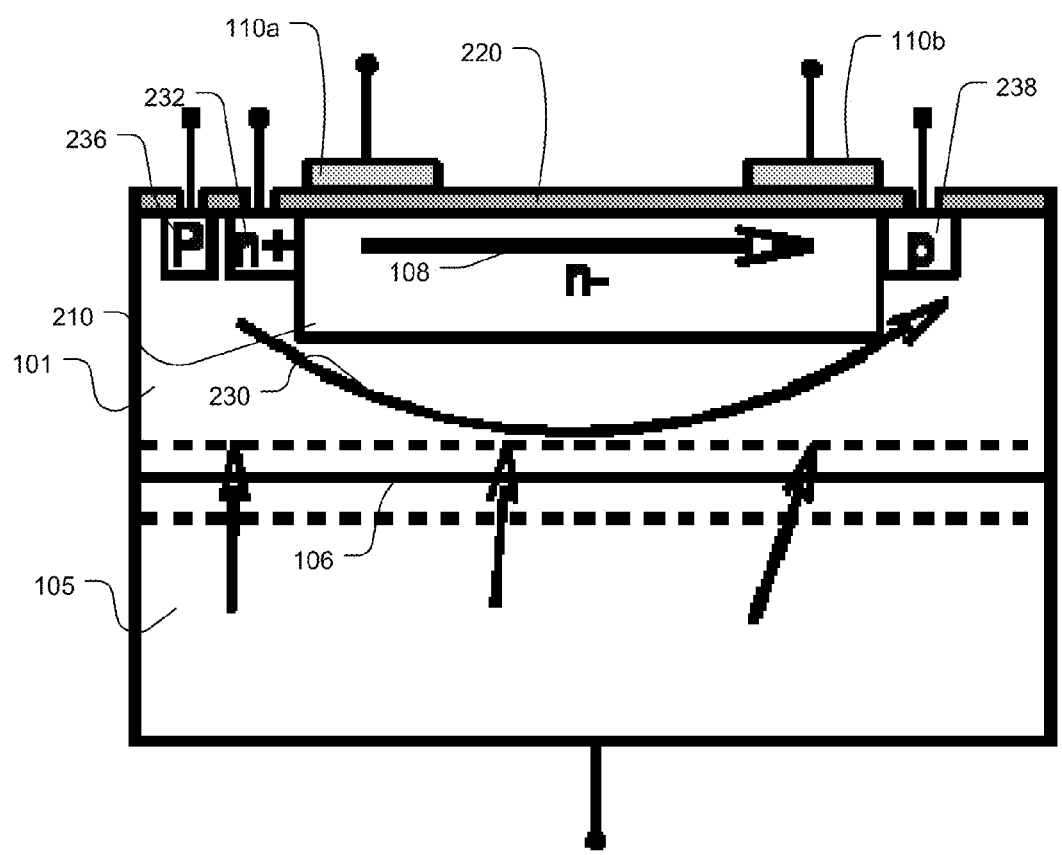
FIG. 8 shows a cross section through the detection region in which the drift field is generated by capacitively coupled gates.

FIG. 8 generated the drift field 108 using the capacitive coupling between two gates 110a, 110b through the detection region 110 of FIG. 3. Just two gates 110a, 110b are formed on top of the insulating layer 220 and separated by an arbitrary distance, which just needs to fulfill at least the minimum design rules. Since the buried implantation 210 fully depletes, the capacitive coupling between the gates 110a, 110b is exploited for generating potential distributions that are advantageous for a fast charge transport.

Figure 9:
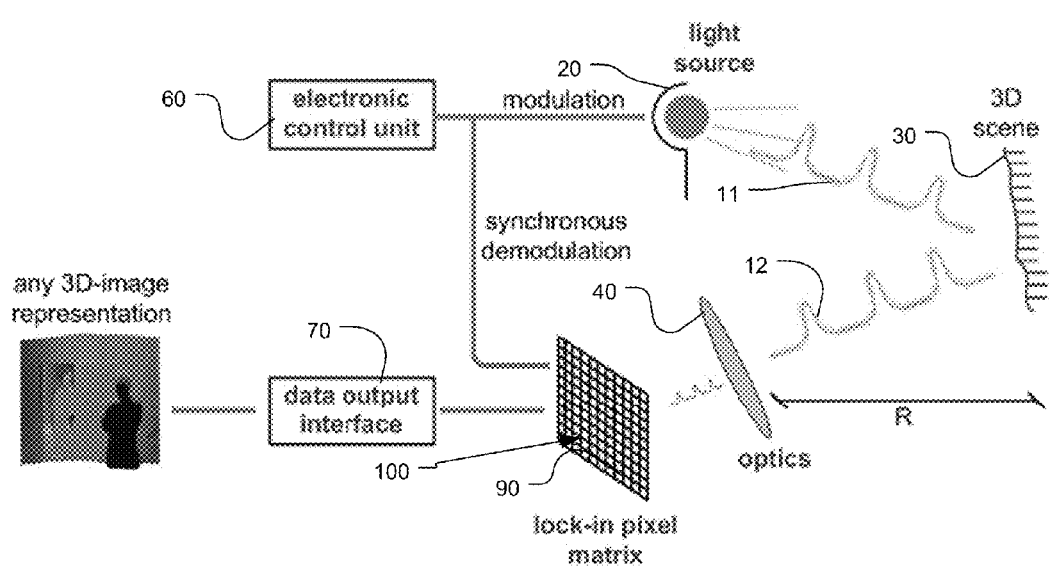
FIG. 9 is a schematic illustration showing the operation of a TOF camera using a demodulation pixel according to the present invention.

FIG. 9 illustrates the 3D TOF camera system using the invented pixel architecture. The light emitter 20 produces modulated light 11 illuminates the scene 30. The returning light 12 from the scene 30 is collected by the camera lens 40, which generally includes a bandpass filter so that only light at the wavelength emitted by the light emitter 20 is transmitted. An image is formed on the TOF detector chip 90 which is a two dimensional array of pixels 100. Control electronics 60, which might be integrated on the same chip as the imager 90, coordinate the modulation of the light emitter 10 with the sampling of the TOF detector chip 90. This results in synchronous demodulation. A data output interface 70 is then able to reconstruct the 3-D image representation using the samples generated by the chip 90 such that a range to the scene is produced for each of the pixels 100 of the detector chip 90.

Typically the demodulation pixel is aimed for being used in 1D or 2D pixel arrays. The invention itself does not set any limitation to the total pixel count of the sensor. Standard or special dedicated read out schemes in the analogue or digital domain can be applied. The invention concentrates on the in-pixel charge transport properties according to the descriptions above, and it is independent on the dedicated sensor topology.

While this invention has been particularly shown and described with references to preferred embodiments thereof, it will be understood by those skilled in the art that various changes in form and details may be made therein without departing from the scope of the invention encompassed by the appended claims.

What is claimed is:

1. A demodulation pixel comprising:
a semiconductor substrate;
a photo sensitive section in the semiconductor substrate for converting light into charge carriers;
storage nodes for receiving the charge carriers;
a demodulation region for transferring the charge carriers to the different storage nodes;
a high-low junction underneath the photo sensitive section for directing charge carriers generated in the photo sensitive section to a surface of the semiconductor substrate for transfer to the demodulation region; and
a non-uniform doping profile in the photo sensitive section for generating a lateral drift field in the photo sensitive section to transfer the charges to the demodulation region.

2. A demodulation pixel, comprising:
a semiconductor substrate;
a photo sensitive section in the semiconductor substrate for converting light into charge carriers;
storage nodes for receiving the charge carriers;
a demodulation region for transferring the charge carriers to the different storage nodes;
a majority carrier current through semiconductor substrate and under the photo sensitive section that directs the charge carriers to the demodulation region.

3. A pixel as claimed in claim 2, further comprising photo gates over the photo sensitive section for generating a lateral drift field to direct the charge carriers to the demodulation region.

4. A pixel as claimed in claim 2, further comprising an n implantation region over the photo sensitive section for generating a lateral drift field in photo sensitive section that has a changing doping concentration in a direction of the demodulation region.

5. A pixel as claimed in claim 2, further comprising capacitively-coupled gates over the photo sensitive section for generating a lateral drift field to direct the charge carriers to the demodulation region.

6. A pixel as claimed in claim 2, further comprising a non-uniform doping profile in the photo sensitive section for generating a lateral drift field in the photo sensitive section to transfer the charges to the demodulation region.

7. A pixel as claimed in claim 2, further comprising a high-low junction underneath the photo sensitive section for directing charge carriers to a surface of the semiconductor substrate.

8. A pixel as claimed in claim 2, further comprising graded or gradually doped substrate for directing charge carriers to a surface of the semiconductor substrate.

9. A pixel as claimed in claim 2, further comprising two majority carrier nodes on either end of the photo sensitive section between which the majority carrier current flows.

10. A pixel as claimed in claim 9, wherein the majority carrier nodes are p-implantations in the semiconductor substrate.

11. A pixel as claimed in claim 2, further comprising a depleted implantation region in the photo sensitive section for facilitating the transport of the charge carriers to the demodulation region.

12. A pixel as claimed in claim 11, wherein the depleted implantation region is funnel shaped in the direction of the demodulation region.

\* \* \* \* \*